United States Patent
Ilyasov et al.

(10) Patent No.: US 12,358,231 B2
(45) Date of Patent: Jul. 15, 2025

(54) METHODS AND DEVICES FOR GENERATING A MESH REPRESENTATION FOR THREE-DIMENSIONAL OBJECTS

(71) Applicant: ANSYS, Inc., Canonsburg, PA (US)

(72) Inventors: Maxim Ilyasov, Laatzen (DE);
Manfred Friedrichs, Lehrte (DE);
Evgeny Ivanov, Brunswick (DE)

(73) Assignee: ANSYS, INC., Canonsburg, PA (US)

( * ) Notice: Subject to any disclaimer, the term of this patent is extended or adjusted under 35 U.S.C. 154(b) by 263 days.

(21) Appl. No.: 17/895,815

(22) Filed: Aug. 25, 2022

(65) Prior Publication Data
US 2023/0278292 A1    Sep. 7, 2023

(30) Foreign Application Priority Data

Mar. 2, 2022   (DE) ..................... 10 2022 104 949.3

(51) Int. Cl.
*G06T 17/20*      (2006.01)
*B29C 64/106*    (2017.01)
(Continued)

(52) U.S. Cl.
CPC .......... *B29C 64/393* (2017.08); *B29C 64/106* (2017.08); *B33Y 10/00* (2014.12);
(Continued)

(58) Field of Classification Search
CPC ......... B33Y 10/00; B33Y 50/02; G06T 17/20; G06T 17/10; G06T 17/00; G06T 17/205; G06T 15/08; G06T 19/00; G06T 2219/2021; G06T 7/64; G06T 2210/36; G06T 7/13; G06T 2207/30164; G06T 2219/021; G06T 2219/008; B28B 3/20; G06F 30/00; G06F 30/23; G06F 30/10; G06F 30/12; G06F 3/04845; G06F 30/17; G05B 19/4099; G05B 19/4097;
(Continued)

(56) References Cited

U.S. PATENT DOCUMENTS

2013/0293541 A1   11/2013  Maisonneuve
2021/0343073 A1*  11/2021  Carrington ............. G06V 10/44

FOREIGN PATENT DOCUMENTS

DE       69829844 T3      10/1998
WO     1998043179 A1    10/1998

OTHER PUBLICATIONS

Lai et al., Hybrid mesh generation for the thin shell of thin-shell plastic parts for mold flow analysis, Aug. 28, 2021 [retrieved Oct. 20, 2024], Engineering with Computers, vol. 38, pp. 4895-4917. Retrieval: https://doi.org/10.1007/s00366-021-01504-6 (Year: 2021).*

(Continued)

*Primary Examiner* — Henok Shiferaw
*Assistant Examiner* — Dennis Rosario

(57) ABSTRACT

A method and apparatus of a device for obtaining a geometric representation of an object including a thin structure having a first surface and a second surface; generating one or more 2D blocking faces as a simplified representation of one of the first surface or the second surface; generating one or more 3D blocks based on an extrusion of the one or more 2D blocking faces; and determining a 3D mesh of the object based on the one or more 3D blocks.

16 Claims, 9 Drawing Sheets

(51) Int. Cl.
  *B29C 64/393* (2017.01)
  *B33Y 10/00* (2015.01)
  *B33Y 50/02* (2015.01)
  *G06F 3/04845* (2022.01)
  *G06F 30/00* (2020.01)
  *G06F 30/10* (2020.01)
  *G06F 30/17* (2020.01)
  *G06T 7/13* (2017.01)
  *G06T 17/00* (2006.01)

(52) U.S. Cl.
  CPC .......... *B33Y 50/02* (2014.12); *G06F 3/04845* (2013.01); *G06T 7/13* (2017.01); *G06T 17/00* (2013.01); *G06T 17/20* (2013.01); *G06T 17/205* (2013.01); *G05B 2219/35017* (2013.01); *G06F 30/00* (2020.01); *G06F 30/10* (2020.01); *G06F 30/17* (2020.01); *G06T 2207/30164* (2013.01); *G06T 2210/36* (2013.01); *G06T 2219/008* (2013.01); *G06T 2219/021* (2013.01)

(58) Field of Classification Search
  CPC ........... G05B 2219/49008; G05B 2219/49007; G05B 2219/49019; G05B 2219/35134; G05B 2219/35017; G05B 2219/35012; G06V 20/64; B29C 64/393; B29C 64/106
  See application file for complete search history.

(56) References Cited

OTHER PUBLICATIONS

Lai et al., Recognition and classification of protrusion features on thin-wall parts for mold flow analysis, Sep. 20, 2019 [retrieved Oct. 20, 2024], Engineering with Computers, vol. 37, pp. 833-854. Retrieval: https://doi.org/10.1007/s00366-019-00859-1 (Year: 2019).*
Willis et al., Fusion 360 Gallery: A Dataset and Environment for Programmatic CAD Construction from Human Design Sequences, Jul. 19, 2021 [retrieved Feb. 7, 2025], ACM Transactions on Graphics, vol. 40, Issue: 4, Article No. 54, 24 pages. https://doi.org/10.1145/3450626.345981 (Year: 2021).*
Elnaghy et al., Complementarity-Preserving Fracture Morphology for Archaeological Fragments, May 31, 2019 [retrieved Feb. 7, 2025], International Symposium on Mathematical Morphology and its Applications to Signal and Image Processing, Volume: Lecture Notes in Computer Science 11564, 12 pages. (Year: 2019).*
[Item V continued] https://doi.org/10.1007/978-3-030-20867-7_31 (Year: 2019).*

* cited by examiner

METHODS AND DEVICES FOR GENERATING A MESH REPRESENTATION FOR THREE-DIMENSIONAL OBJECTS

This application claims the benefit of the filing date of German patent application number 10 2022 104 949.3, which was filed on Mar. 2, 2022, which is hereby incorporated herein by reference in its entirety.

FIELD OF INVENTION

The field of this disclosure relates to methods and devices for generating a mesh representation for three-dimensional objects.

BACKGROUND OF THE INVENTION

Mesh generation is the practice of creating a mesh, a subdivision of a continuous geometric space into discrete geometric and topological cells. Usually the cells partition a geometric input domain. Mesh cells are used as discrete local approximations of a larger domain. Mesh representations can serve physical analyses of real objects by methods such as finite element analyses or computational fluid analyses. Meshes can be composed of simple cells like triangles or other forms. A mesh enables operations such as finite element calculations in order to analyze, generated, or produce an object. A mesh can be structured and unstructured. In structured meshing the mesh is a regular lattice, such as an array, with implied connectivity between elements. In unstructured meshing, elements may be connected to each other in irregular patterns, and more complicated domains can be captured. Mesh generation for 3D-based analyses can be difficult, in particular for thin objects. A mesh alongside a thin surface can be inaccurate or too coarse when generated by prior art methods or involve many different steps. Improvements in these areas are desirable.

SUMMARY OF THE DESCRIPTION

A method and apparatus of a device for obtaining a geometric representation of an object; determining a surface of the object as a thin surface indicating the object including a thin structure based on the geometric representation of the object, wherein the thin surface is adjacent to a first surface and a second surface of the thin structure, the first surface and the second surface being larger in size than the thin surface; identifying one of the first surface or the second surface of the thin structure as a source surface for an extrusion; determining one or more 2D blocking faces to represent the source surface; performing the extrusion from the one or more 2D blocking faces toward another one of the first surface or the second surface, wherein a 3D representation of the object is established based on the extrusion of the one or more 2D blocking faces; and generating a 3D mesh based on the 3D representation of the object.

Other methods and apparatuses are also described.

BRIEF DESCRIPTION OF THE DRAWINGS

Advantages and features result from the disclosure are illustrated with references to the figures. The figures describe the embodiments in principle and are not necessarily to scale. The dimensions of the various features may be enlarged or reduced, in particular to facilitate an understanding of the described technology.

DETAILED DESCRIPTION

Figure 1A:
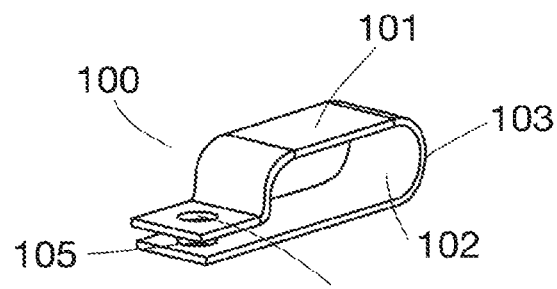
FIGS. 1A-H show various phases of a process to generate a mesh according to an embodiment of this disclosure.

In the following descriptions, identical reference signs refer to identical or at least functionally or structurally similar features.

In the following description reference is made to the accompanying figures which form part of the disclosure, and which illustrate specific aspects in which the present disclosure can be understood.

In general, a disclosure of a described method can also be applicable to a corresponding device (or apparatus) for carrying out the method or a corresponding system comprising one or more devices and vice versa. For example, if a specific method step (or operation) is described, a corresponding device may include a feature to perform the described method step, even if that feature is not explicitly described or represented in the figure. On the other hand, if, for example, a specific device is described on the basis of functional units, a corresponding method may include one or more steps to perform the described functionality, even if such steps are not explicitly described or represented in the figures. Similarly, a system can be provided with corresponding device features or with features to perform a particular method step. The features of the various exemplary aspects and embodiments described above or below may be combined unless expressly stated otherwise.

An objective of the embodiments disclosed in the following is to improve the generation of a mesh representation for a three-dimensional object. In particular an objective can be an improvement of an analysis and/or model generation of a 3D object or volume. Furthermore, an objective can be to discretize a thin geometrical configuration into solid elements in a more robust way and to provide a predetermined number of elements through the thickness of a representation of a real object, for more accurate analyses of its various physical phenomena and/or as an intermediate step in a developmental or design process.

These problems are solved by the disclosed embodiments, which are in particular defined by the subject matter of the independent claims. The dependent claims provide further embodiments. In the following, different aspects and embodiments of these aspects are disclosed, which provide additional features and advantages.

Some embodiments solve the problem to generate a mesh for a physical domain, such as a mechanical object, in order to perform an FEM-analysis for the object. Therefore, geometrical data, e.g. CAD data, for the object is obtained and a thickness of the object is automatically determined. This is done by determining a maximal distance between two non-thin surfaces of the object. The non-thin surfaces can be determined by an autodetection and/or selected manually by a user based on a representation of the object in a computer. Afterwards a source surface is determined from the set of non-thin surfaces.

Based on the source surface 2D blocking faces are generated that form the basis of a volume in which the mesh can be generated. This volume is generated by an extrusion of the 2D blocking faces towards a target surface, which was also selected from the non-thin surfaces. Within the extruded volume a 3D mesh of the object is generated. The mesh is controlled by the selection and formation of the 2D blocking faces that represent the source surface A first aspect of the disclosure relates to a method, comprising the steps:
- obtaining a geometric representation of an object including a thin structure, wherein a geometry of the thin structure is represented by a thin surface and non-thin surfaces, including a source surface;
- generating one or more 2D blocking faces as a representation of the source surface, this can be a simplified representation but in can also comprise elements that are not comprised by the source surface, in particular in order to control the generation of the mesh;
- generating one or more 3D blocks based on an extrusion of the one or more 2D blocking faces;
- determining a 3D mesh of the object based on the one or more 3D blocks.

The method is a computer-implemented method. A computer can be any electronic computation device, such as a personal computer, a microcontroller or an FPGA to name some examples.

An object can be an existing, real object or volume (e.g. a fluid) or an object or volume to be produced, developed, or obtained in any other way. An object may also be part of another object, e.g. a stair may be defined as an object within a staircase. A geometric representation of the object may be inferred from the object automatically, e.g. by measuring the object, or manually, e.g. by drawing or sketching the object, or at least be obtaining one or more geometric parameters of the object, for example by scanning the object. A geometric representation of the object can comprise information on the volume, i.e. 3D-related information. It can also comprise a representation in a computer aided design, CAD, format. A geometric representation can also be obtained by a photo or a sketch of the object. This geometric representation can then be further processed by the computer (e.g. by filtering) such that all the information is present necessary to extract further parameters of the object, e.g. a thickness of the object.

A thin structure can be any structure that includes a thin surface. In general, a thin structure can relate to any structure of an object. "Thin" in this context means that at least one of the two dimensions of the surface is smaller than the other dimension and/or smaller than a certain threshold. As also explained later, a thin surface can be a surface that comprises a dimension smaller or equal than a thickness of the object.

A thickness can also be obtained in a different way, as explained in more detail below. A thickness is usually determined between two surfaces (e.g. an inner surface and an outer surface of a wall) of the object or based on a cross section of a shell or wall of the object.

Correspondingly, non-thin surfaces are determined as the surfaces of the object that are not thin and/or that are not determined as thin. Additionally or alternatively, a thin and/or non-thin surfaces can also be determined manually, in particular such that a surface is determined as thin although there exists a surface which is thinner and not determined as thin. Hence, what is thin and what is not thin needs not necessarily to be defined by a thickness of the object alone.

The object and/or the thin structure of the object can have a first surface and a second surface. These surfaces can be determined automatically, semi-automatically, or manually. The first and/or the second surface can comprise a plurality of elementary surfaces, which are connected. The first and the second surface can be determined as non-thin surfaces and/or selected from the set of non-thin surfaces. The first and/or the second surface can be adjacent to a thin surface of the object.

An extrusion (or sweeping, pulling) operation generates a 3D volume from a 2D surface or face as a source surface of the extrusion. For example, a source surface of an extrusion can be a surface of the object used as a basis for the extrusion. That means, the extrusion will start from the source surface and/or from one or more faces of the one or more 2D blocking faces that correspond to the source surface. A non-thin surface of an object can be selected as a source surface for an extrusion. In some embodiments, an extrusion may be performed based on one or more 2D blocking faces representing a source surface of the extrusion. These 2D blocking faces or faces may correspond to abstractions or simplified representations of the source surface from which the extrusion starts. Based on this abstraction, an accurate mesh can be generated.

One or more 2D blocking faces provide a 2D blocking representation of a surface. Normally, the 2D blocking representation can be a simplified geometry representation of a surface of the object. By a 2D blocking face not all features of a corresponding source surface may be represented.

In case the object is a brick, one 2D rectangular blocking face will be sufficient to represent a surface of the brick. A 2D blocking representation of an object having a staircase can comprise a 2D blocking face representation of each stair of the staircase. A 2D blocking face is a 2D geometry representation including nodes and edges. By the blocking nodes and edges, blocking faces can correspond to areas bounded by a loop of edges connected by nodes. The edges can be straight. The details of the 2D blocking representation can be controlled by a user. The 2D blocking representation can have the same, more, less or different features compared to the original object. Thereby, a user has control (e.g. via a user interface) of the representation of the object and of the mesh that is based upon the representation.

A 2D blocking representation is a discretization of the original object. Normally a 2D blocking face can have a rectangular shape. Additionally or alternatively, a 2D blocking face can also have another form, such as a form of a triangular, trapezoid, or any polygon in general. A 2D blocking face can also have a round or ellipsoidal form as well as an amorphic form. The form of a 2D blocking face can be pre-determined and/or depending on the source surface. By the set of 2D blocking faces (the 2D blocking representation) the details of the source surface of an extrusion can be mapped such that essentially all the features of the source surface of the extrusion are sampled by the 2D blocking faces. In another embodiment the 2D blocking faces can be selected such that not all details of the source surface of an extrusion are included in the 2D blocking faces.

The extrusion of a 2D blocking face can be performed along one or both of the surface normals of the 2D blocking face or of the corresponding surface (e.g. source surface of the extrusion) of the object. The meshing of the object is performed based on a 3D representation, i.e. the extruded representation, of the object. That does not necessarily mean that the mesh is defined after the extrusion. In one embodiment the mesh can be defined based on the nodes of the 2D blocking faces or on different parameters. The mesh can then be generated when the 2D blocking faces are extruded.

The embodiments of the first aspect and also of the further aspects can be used for analyzing, generating, producing, controlling, digitizing, visualizing, or monitoring a three-dimensional object or volume. For example, an embodiment can be used to monitor a structural integrity of a bridge and issue a warning if the bridge is going to suffer from structural failure. In another embodiment a mesh is generated in order to visualize and/or animate a representation of an object or of the volume. An embodiment can also be used within a development or production process of an object, e.g. a chassis of a car.

An embodiment of the first aspect can comprise the following steps
  obtaining a geometric representation of an object;
  obtaining and/or determining a thickness of the object:
  determining a thin surface and non-thin surfaces based on the geometric representation and the thickness of the object;
  determining a source surface from the non-thin surfaces;
  determining one or more 2D blocking faces based on the source surface;
  determining a 3D representation of the object based on an extrusion of the one or more 2D blocking faces;
  determining a 3D mesh based on the 3D representation of the object.

An embodiment of the first aspect relates to a method, wherein a thickness is determined for a thin structure.

The thickness can be obtained manually by entering a thickness value, e.g. via a user interface, or a value based on which the thickness value can be computed.

An embodiment of the first aspect relates to a method, wherein the thickness is obtained via a user interface.

In particular a source surface and a target surface for an extrusion operation can be provided manually (e.g. via a user interface), and the thickness can be provided as a distance between the two surfaces. In particular the maximum distance between the two manually provided surfaces can be determined as the thickness value. Thereby, the target surface is the surface that marks the end of the extrusion of the source surface (or of the one or more 2D blocking faces that represent the source surface).

An embodiment of the first aspect relates to a method, wherein the thickness is obtained based on the geometric representation of the object.

As in the embodiment described previously, the thickness can be automatically detected based on manually selected non-thin surfaces, in particular a manually selected source surface and a manually selected target surface. Additionally or alternatively, other methods of determining the thickness of the object are possible. In particular, an automatic thickness determination can be based on a graphical and/or geometric evaluation of the object, i.e. an evaluation of the geometric features of the object. Another embodiment with an automatic thickness determination is described in the following.

An embodiment of the first aspect relates to a method, comprising the step:
  determining the two largest surfaces of the object based on the representation of the object; and
  determining the thickness as a distance between the two largest surfaces of the object, in particular based on a maximum distance of these surfaces.

The two largest surfaces can be determined by a graphical and/or geometric analysis of the geometric properties of the object. In particular, a surface and the size of this surface can be determined based on a "flood fill" algorithm. A flood fill can also be called "seed fill" or "boundary fill". A flood fill is an algorithm that determines the surface connected to a given node. For example, once the size, form, and location of a surface is known, the thickness can be computed based on a distance between the two surfaces with the largest sizes of an object. This distance can be the maximum distance between these non-connected largest surfaces. A maximum distance can be based on a straight line between the two surfaces. In particular, a maximum distance can be defined as the longest straight line between the two surfaces selected from the set of straight lines each starting at a point on one surface and ending at the closest point on the other surface. In this case, the starting points can be selected randomly, manually (e.g. by a user interface), or automatically (e.g. based on a predefined grid applied to the respective surface.)

An embodiment of the first aspect relates to a method, comprising the step:
  determining a simplified 3D blocking representation of the object based on the thickness of the object.

A 3D blocking representation is a structure that provides an, in particular simplified, 3D geometry representation. It consists of nodes and edges. By the blocking nodes and edges, blocking faces are defined as areas bounded by a loop of edges which are connected by nodes. Thereby 3D volume blocks are defined. The blocks are associated to the corresponding geometry of the object. The associated blocking can be used for more robust and flexible discretization of the given computational domain avoiding many of the constraints of detailed CAD formats.

A three-dimensional blocking can be a complexity reduced representation of the object. That means the three dimensional blocking does not comprise all elements of the object. In particular the two largest surfaces that are separated from each other by the determined thickness may be determined based on the 3D blocking representation of the object. Based on the 3D blocking representation one or more thin surfaces and/or non-thin surfaces can be determined. Additionally or alternatively, the source surfaces or the target surfaces for extrusion operations can be determined among the non-thin surfaces.

An embodiment of the first aspect relates to a method, comprising the step:
  determining one or more loops on the 3D blocking representation, wherein each loop bounds a face, a set of connected faces, or a hole; and each loop comprises edges that extend between nodes.

Thin surfaces and non-thin surfaces of an object can be identified from surfaces of the object based on an analysis of the edges of one or more loops on the 3D blocking representation of the surfaces of the object. Rules for an analysis of loops with respect to whether they represent a thin surface, or a non-thin surface are provided in the following.

An embodiment of the first aspect relates to a method, wherein a thin surface of the object is determined based on the corresponding face of the 3D blocking representation, if the face is one of the following:
  bounded by a single loop, and a length of each edge is equal or shorter than the determined thickness;
  bounded by a single loop and a distance from one edge to an opposite edge is equal or shorter than the determined thickness, wherein the edges are greater than the determined thickness (remaining edges can be shorter than the determined thickness);

bounded by two loops wherein a distance between the loops is equal or less than the determined thickness.

A 3D blocking representation can comprise different parts or forms to represent the geometry of the original object. Typically, a surface of the object can be identified as a thin surface according to an area of connected thin blocking faces of the 3D blocking representation. A thin blocking face corresponds to an area bounded by a single loop that includes opposing edges, such as a rectangular loop, spaced apart by a distance equal to or less than the determined thickness. If a blocking face is thin, then all associated or corresponding geometry surfaces are considered thin or as thin surfaces.

A thin surface can also be identified if its corresponding face of a 3D blocking representation is bounded by two loops, e.g. for a cylinder. For a cylinder, a representing face will be bounded by two loops, an outer loop and an inner loop. For a thin surface with two loops, a maximal distance between these two loops should be equal or shorter than the determined thickness.

Every blocking face is associated with one or more surfaces of the object. If the blocking face is determined or recognized as 'thin', all associated surfaces of the associated geometry are 'thin'.

An embodiment of the first aspect relates to a method, wherein the determination of the source surface is performed based on one or more of the following information:
  a manual selection;
  a meshed surface that is shared with another object;
  a non-smooth surface;
  one or more predefined features of a surface of the object, in particular a surface being larger than another non-thin surface.

In particular the above list may be used as a prioritization for a determination of a source surface for an extrusion. For example, the determination method can check if a source surface has been selected manually. If not, the method can check if a meshed surface (or face) exists that is part of the object. This can be the case if a surface is shared between the object and another object. If such a meshed surface exists, this surface can be identified as a source surface. This has the advantage that the mesh generated for the two objects is consistent. If no shared surface exists, the method can check if a non-smooth surface exists. A non-smooth surface can be selected as a source surface because it might be easier to generate a mesh starting from a more complex surface instead of a smooth, i.e. less complex, surface. This is also explained later in combinations with the figures. In some embodiments, a surface can be identified as a source surface based on predetermined features for the surface of the object or of the object itself. For example, one of the non-thin surfaces of the object can be selected as a source surface. Additionally or alternatively, the source surface can also be selected randomly from the set of non-thin surfaces. Other combinations of these alternatives or isolated uses of these alternatives are of course possible.

An embodiment of the first aspect relates to a method, wherein a face of the one or more 2D blocking faces has more details than a corresponding face of the 3D blocking representation.

The 3D blocking representation can be restricted to the purpose of determining thin and non-thin surfaces of the object. Therefore, the 3D blocking representation can be a complexity-reduced representation of the original object, i.e. not all features of the object are represented in the 3D blocking representation.

A surface identified as a source surface of an object can be represented based on 2D blocking representation, e.g. including one or more 2D blocking faces that sample the source surface. Generation of a 2D blocking representation for a surface can be controlled by a user (e.g. via a user interface) and/or automatically. 2D blocking representation of a surface can be generated to capture all important features of the surface. However, other embodiments are possible. For example, the 2D blocking representation can be generated to only sample the important features of a source surface. The important features can be manually selected by a user or automatically selected by an algorithm based on predetermined requirements. In such a case a 2D blocking is a complexity-reduced representation of the source surface. In some embodiments, the 3D blocking representation is only employed to detect thin and non-thin surfaces of an object. A 2D blocking representation can be applied to represent a source surface for an extrusion to provide more information about the source surface of an object than the corresponding 3D blocking representation of the object.

An embodiment of the first aspect relates to a method, wherein the determination of the one or more 2D blocking faces is based on one of the following:
  the obtained geometrical information of the object;
  a pre-defined element shape;
  a pre-defined size.

The 2D blocking representation of a source surface can be used to control the details of the extruded object, i.e. of the final 3D representation of the object and/or of the mesh of the object. Therefore, the 2D blocking representation can be based on one or more geometrical features of the object. These features can in particular be taken from the geometrical representation obtained initially about the object.

Additionally or alternatively the 2D blocking representation, or at least one of the 2D blocking faces of the 2D blocking representation, can comprise a predetermined feature, such as a predefined element shape. For example, if the object comprises a hole, which is round, the 2D blocking representation can sample this hole as a rectangular hole. This might be done with respect to the mesh to be generated for the extruded representation of the object.

Additionally alternatively certain parts of surfaces or certain surfaces can be left out for the creation of the 2-D blocking representation. For example if the object comprises fillets at the transition between two larger surfaces that are inclined towards each other, then these fillets can be left out in the 2-D blocking representation.

Additionally and alternatively, the 2D blocking representation can comprise 2D faces that capture a certain form of the original object in a different, in particular complexity-reduced, way. For example, a cylindrical form of an object's surface can be represented by blocking faces that form a rectangle. Later for the extrusion, the original form might be re-associated with the blocking face such that the extrusion leads to the original form again.

Additionally or alternatively, a size function can be applied such that an element of a source surface is mapped or extruded to a target surface non-uniformly (e.g. in varied sizes) to one or more corresponding faces of a 2D blocking representation. In particular a size function can be combined with an element shape and/or a form function as described previously in order to alter size and form of an element of a source surface when mapped to a 2D blocking face.

Additionally or alternatively, a defeaturing tolerance can be set manually by a user to influence discretization accuracy of the 2D blocking representation.

An embodiment of the first aspect relates to a method, comprising the step:

determining a target surface from the set of non-thin surfaces; and wherein the extrusion is performed from the one or more 2D blocking faces to the target surface.

An extrusion may be performed according to a direction from a source surface of the extrusion. Additionally or alternatively, a distance (e.g. the thickness) can be provided according to which the extrusion can be performed, from a source surface. In a particular embodiment, such a distance can also be provided based on a target surface. Then, the extrusion will be performed from the source surface to the target surface. In case a corresponding 2D blocking representation comprises a plurality of 2D faces then the plurality of 2D faces can be extruded based on different or varied extrusion directions that can be inferred or determined from the target surface.

Additionally or alternatively, an extrusion can also be performed in the direction of the normal, i.e. the orthogonal direction, of a 2D blocking face. In this case, the distance or amount of the extrusion can be obtained based, for example, on the target surface.

An embodiment of the first aspect relates to a method, wherein the extrusion of one or more 2D blocking face is based on the geometrical information of the object.

Information about the geometry of the object can be used for the determination of the 2D blocking representation, as explained for the previous embodiment. Similarly, information about the geometry of the object, in particular the geometry-related information obtained initially, can be used for the extrusion of one or more of the blocking faces. In particular, an extrusion of a single 2D blocking face can be performed such that, for example, the amount and direction of the extrusion from a point on the 2D blocking face can depend on its position within the blocking face. A uniform extrusion might also be possible. But in most cases an extrusion that is based on the geometrical properties of the object can lead to a better 3D representation of the object.

An embodiment of the first aspect relates to a method, wherein the determination of the 3D mesh is based on one or more of the following:

a predefined number of mesh layers sectioning the 3D-representation essentially perpendicular to a thin surface or a corresponding 2D blocking face;
nodes of a loop of a surface;
one or more 2D blocking faces;
the extrusion.

The mesh generated for the 3D representation of the object can be based on various information, e.g. edge shapes and bunching of the edges. The extrusion algorithm (which creates the 3D blocking from the 2D source blocking) can link the shape and the mesh node distribution of a 2D blocking face to the target surface, e.g. the edges of the 2D blocking edges can be linked to the edges of the target surface.

A user can manually provide parameters for the geometry (curves or surfaces) of the 3D representation and therefore also for the mesh. The subsequent extrusion can then depend on these parameters and a mesh can be generated accordingly.

A second aspect relates to a device, configured for:

obtaining a geometric representation of an object;
determining a thin surface and non-thin surfaces based on the geometric representation of the object;
determining a source surface from the non-thin surfaces;
determining one or more 2D blocking faces based on the source surface;
determining a 3D representation of the object based on an extrusion of the one or more 2D blocking faces;
determining a 3D mesh based on the 3D representation of the object.

The determination of thin and non-thin surfaces of the object can be based on thickness information of the object. The device can be configured to obtain such thickness information in several ways. In one embodiment, the device can be configured to obtain the thickness information manually via a user interface. Additionally or alternatively, the device can be configured to obtain the thickness information based on an automatic or manual selection of one or more source surfaces and one or more target surfaces. Additionally or alternatively, the thickness information can be determined based on one or more loops that border a certain surfaces or face, as described in connection with the first aspect.

Embodiments of the second aspect can comprise the same or similar features as the first aspect and/or the third aspect.

A third aspect relates to a computer-implemented method, comprising the steps:

obtaining, in particular measuring, a geometric representation of an object, the geometric representation including a narrow surface, a first surface and a second surface for a thin structure of the object and wherein the narrow surface being adjacent to the first surface and the second surface;
generating at least one blocking face as a simplified representation of the first surface;
generating a volume block based on an extrusion from the at least one blocking face towards the second surface; and
generating a 3D mesh for the object based on the volume block.

The narrow surface can be, for example, an edge surface and/or thin surface of an object. The first and the second surface can be surfaces connected to the edge surface, for example a front surface and a rear surface of the object. A blocking face can be a 2D face. The blocking faces can be chosen in order to achieve a desired mesh for the object. During the generation of the volume block based on a blocking face, further geometric adaptations can be performed on the block, in particular based on the geometric information of the object and/or based on the mesh for the object. The generation of the mesh can be performed during and/or after the generation of the volume block.

Embodiments of the third aspect can comprise the same or similar features as embodiments of the first aspect and/or the second aspect.

FIGS. 1A-H describe an embodiment of the disclosed mechanism for generating a mesh for a clamp object 100. A geometric representation, as depicted in FIG. 1, of a clamp 100 is obtained, e.g. by measurement, user inputs, network interface, accessing storage devices, or other applicable receiving or generating operations, at the beginning. The geometric representation can be, for example, an optical representation such as a photo or a video, or a more abstract representation, such as a set of parameters contained, for example, in a CAD file. In some embodiments, a geometric representation may include representations of curves, surfaces, volumes, parametric curves, parametric surfaces, level-sets or other applicable elements of geometric models.

The clamp 100 comprises an outer surface 101 and an inner surface 102 that are connected by a thin outer wall surface 103. These surfaces form the thin structure of the clamp 100. Furthermore, the clamp contains two holes 104, 105 that are arranged above each other, in order to fixate the clamp with a screw. Both holes 104, 105 also have one wall surface each, the thickness of which is equal to the thickness of the outer wall surface 103.

Figure 1B:
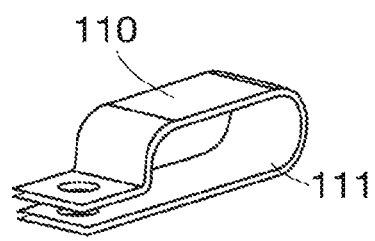

In a topology analysis, this general structure of the clamp 100 is analyzed by a computer. In FIG. 1B, the computer has identified the two largest surfaces 110, 111 of the clamp 100, which correspond to the outer surface 101 and to the inner surface 102. The identification of these two largest surfaces can be for example done by a flood fill algorithm, which can be used, for example, to identify the set of surfaces that are connected (e.g. via edges) smoothly. In a next step, a maximal distance between the two largest surfaces 110, 111 is determined. The maximal distance can be defined, for example, as the largest of all distances selected from a point on one of the surfaces to the closest point on the other surface. The starting points can be selected manually, automatically, and/or randomly. This parameter serves as the thickness value of the clamp 100 throughout the further analysis. Based on the thickness value thin surfaces and non-thin surfaces of the clamp are identified.

Figure 1C:
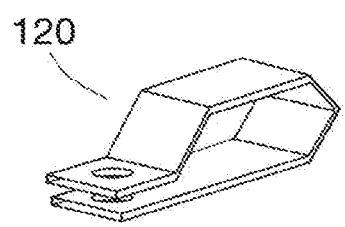

In FIG. 1C a simplified 3D representation 120 is shown that is based on the identified information, the two largest surfaces 110, 111 and the thickness value, in order to model the clamp 100. This can be done, for example, by a 3D blocking representation, in which the clamp is sampled by 3D-blocks. As can be seen, the simplified 3D blocking representation 120 only bears principal resemblance to the original clamp. The 3D blocking representation does not comprise all details of different parts of the clamp 100. For example, the non-flat surfaces of the original clamp 100 are represented by a number of flat surfaces that are interconnected. Based on the blocking representation 120 and on the geometrical input of the original clamp 100, all thin surfaces and all non-thin surfaces of the clamp can be identified.

Figure 1D:
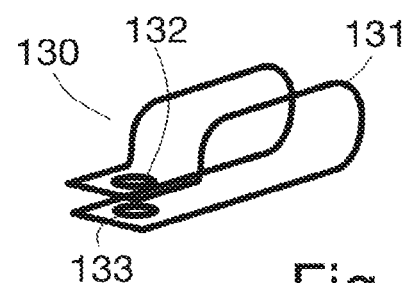

In FIG. 1D a representation 130 that only comprises information on the thin surfaces of the clamp 100 is depicted. Based on the identified thickness value, it can be defined that all surfaces of the clamp 100 with a cross dimension (e.g. a length of a line from one edge of the surface to an opposite edge of this surface) or width smaller or equal of the identified thickness value are thin surfaces. Based on the representation of FIG. 1D, it can be seen that three surfaces fulfil the requirement to have a width which is smaller or equal than the identified thickness value. These surfaces are the surface 131, which is the thin outer wall surface of the clamp 100, and the surfaces 132 and 133, which are the inner wall surfaces of the holes 104 and 105. The remaining surfaces of the clamp 100 are defined as non-thin surfaces.

Based on the non-thin surfaces, a source surface is identified. This can be done, for example, based on a user selection. Alternatively, this can be done by choosing the largest surface or by choosing randomly amongst the identified non-thin surfaces. In general, non-thin surfaces can be connected to thin surfaces via an edge or via another surface. For example, the thin surfaces shown in FIG. 1D share an edge with the non-thin surfaces 110 and 111 of FIG. 1B.

Figure 1E:
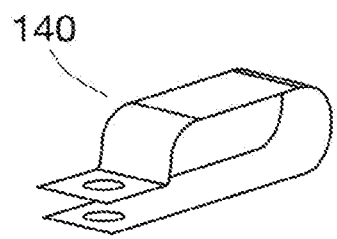

In FIG. 1E, it is shown that the surface 110 (in FIG. 1B), is determined as the source surface 140. The source surface forms the basis for the extrusion performed later in order to arrive at a 3D representation for generation of the mesh for the original object 100. Once the source surface 140 is determined, this information is further processed in order to arrive at a starting point for performing the extrusion. This is done by transforming the source surface 140 into a 2D representation.

Figure 1F:
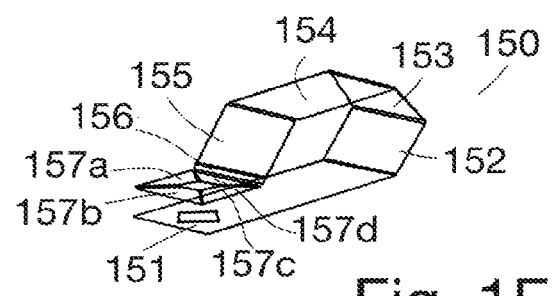

In FIG. 1F a 2D representation 150 is depicted, which consists of a set of flat 2D faces. The determination of the 2D representation can be based on different rules and/or information, in particular with respect to the mesh to be determined for the object 100. In FIG. 1F it can be seen that the source surface 140 is modelled by a plurality of plain or elementary faces 151, 152, 153, 154, 155, 156, and 157a to 157d. These faces are chosen to model the area of the clamp 100 around the upper hole 104 in order to achieve a concentric mesh for this part of the clamp. On the other hand, the area with the lower hole 105 is modelled by a single face 151 that comprises a rectangular opening as a representation of the lower hole 105. The different representations of the area around the upper hole 104 and the area around the lower hole 105 are based on the different requirements for the mesh to be generated for the respective area in this embodiment. The extrusion can be performed based on an abstract representation of the source surface, for example, as a set of 2D faces.

Figure 1G:
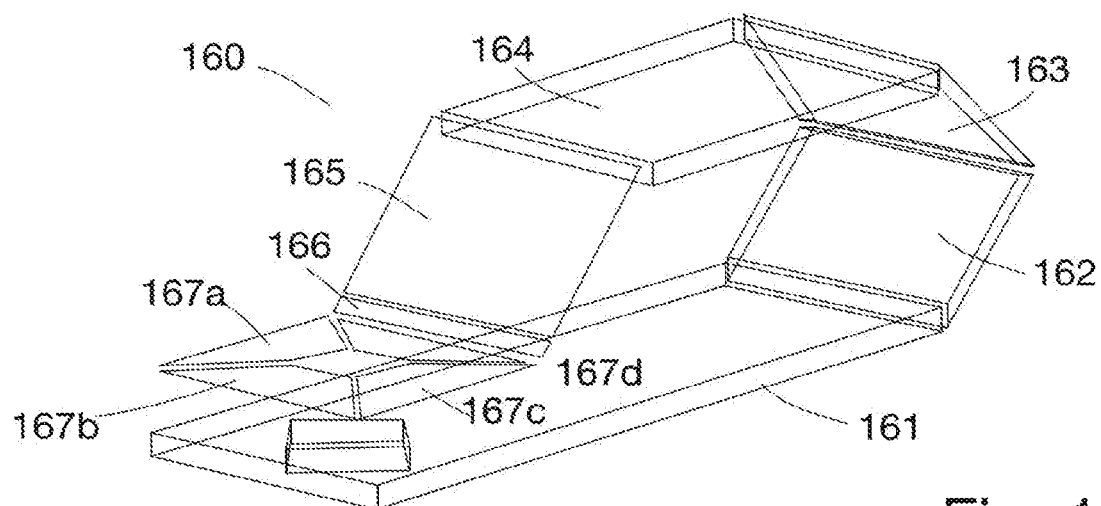

In FIG. 1G the result of some extrusion processes are shown. Not all 2D faces are extruded yet. The extrusion can be based on a target surface including a set of end points for the extrusion. A mapping is necessary from the source surface to the target surface, if the target surface has a different form or different extension as the source surface. A target surface can be selected, similar to the selection of a source surface, based on the set of non-thin surfaces. As shown, the inner surface 102 from the clamp 100 is determined as the target surface. Hence, the extrusion is performed starting from the 2D-representations of the outer surface 101 (source surface 140) to the inner surface 102. Alternatively, the extrusion can also be based on the thickness value determined at the beginning of the process. In FIG. 1G the result of extrusions of the faces 151, 152, 153 and 154, the 3D blocks 161, 162, 163, and 164 are depicted. The extrusion of the 2D faces can be based on additional information, for example, the geometrical information of the object or based on the requirements for the mesh, to be generated. For example, if a given number of mesh layers across a thin surface should have a predefined distance, then the extrusion has to be based on this information. During the extrusion or after the extrusion, the mesh can be generated.

Figure 1H:
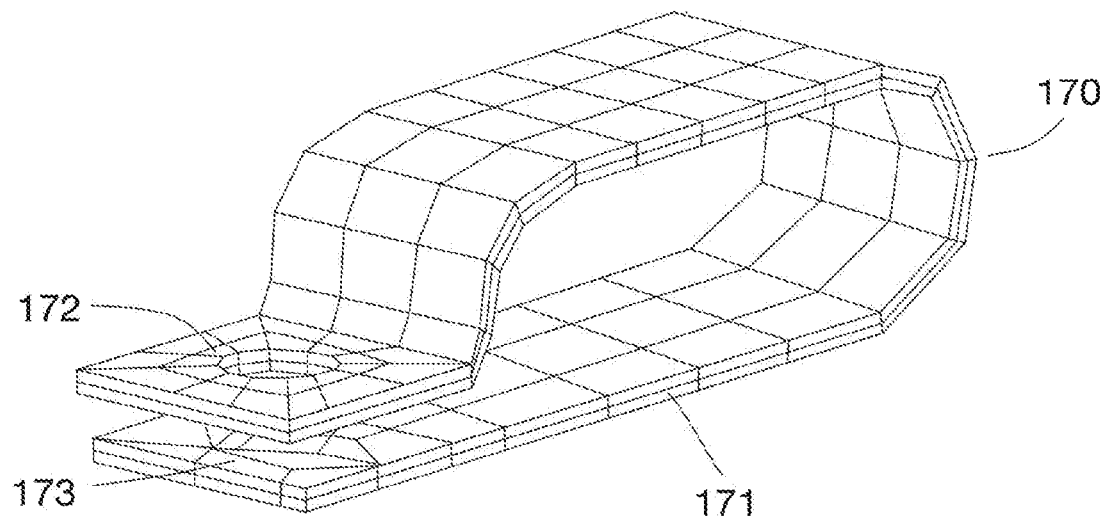

In FIG. 1H a generated mesh 170 to represent the clamp 100 is shown. The mesh 170 extends across the thin wall 171 of the clamp. In the area of the holes, two different mesh structures are visible. In the area around the upper hole 104 of the clamp 100, the mesh structure 172 is concentrically arranged around the hole. The mesh structure 173 around the lower hole 105 of the clamp 100 is generated as a Voronoi map. This shows how different requirements for the mesh can be realized by using different 2D faces to sample the different areas of the source surface.

The procedure as shown in this embodiment can be divided into three different phases. At first, the incoming information about the real object is used for a topology analysis. This is shown in FIGS. 1A-1D. During the topology analysis the thin and non-thin surfaces of the object are identified in order to determine a source surface and optionally a target surface. In a second phase, a basis for the extrusion is determined and further processed. Based on the source surface a 2D representation is determined in order to take into account mesh requirements at an early stage. This is shown in FIGS. 1E-1F. In the third phase, which is depicted by FIGS. 1G and 1H, the extrusion is performed, and the mesh is generated based on the 3D blocking, which is created by extrusion of the 2D representation of the source surface to the target surface or another target information.

Figure 2A:
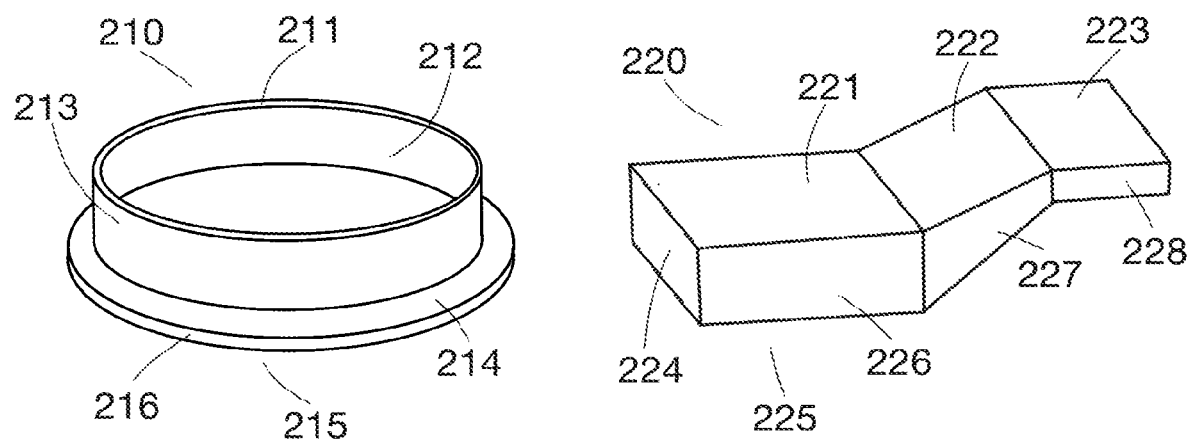
FIGS. 2A, 2B show a thickness detection according to an embodiment of this disclosure.
Figure 2B:
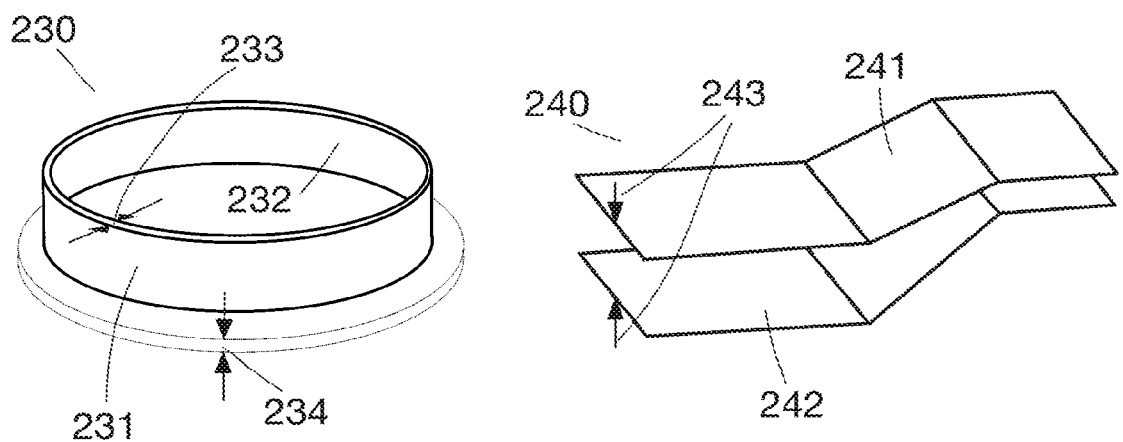

FIG. 2A and FIG. 2B show the detection of the thickness parameters for two different kinds of objects. FIG. 2A shows on the left-hand side a cylindrical object 210. The object comprises a cylindrical part with an inner surface 212 and an outer surface 213. The two surfaces are separated by a surface 211 forming a cylindrical wall on top of the cylindrical object. The bottom the cylindrical object 210 comprises a base ring that consists of an upper surface 214 and a lower surface 215. Both surfaces are separated by the wall surface 216. On the right-hand side of FIG. 2A a rectangular object 220 is depicted. The object 220 as an upper surface which comprises the rectangular surfaces 221, 222, and 223. Further, the object 220 comprises a lower surface 225. The upper surface and the lower surface are separated by the side surfaces 224, 226, 227, and 228. Other side surfaces do exist but are not visible in the figure.

FIG. 2B shows an abstraction or aspects of the geometrical input information 230 provided in FIG. 2A, for the two different kinds of objects, in order to determine a thickness of each object. On the left and side, for the cylindrical part of the object 210, the two largest surfaces have been identified. The outer surface of the cylindrical part of the object 210 is the surface 231. The inner surface of the cylindrical part of the object 210 is the surface 232. The surfaces have been identified by an identification of the largest smoothly connected area, e.g. by a flood-fill-based detection. The distance 233 between the two cylindrical surfaces 231 and 232 is taken as a thickness value for the thickness of the wall surface 211. The thickness 234 of the wall surface 216 can be determined in the same way.

On the right hand side of FIG. 2B, the determination of the thickness for the rectangular object is depicted. The two largest surfaces of the object 220 are identified as the surfaces 241 and the lower surface 242. Both surfaces respectively consist of three elementary surfaces. For example, surface 241 includes elementary surfaces 221, 222, 223. An elementary smooth surface may be a smooth portion of a surface (e.g. geometric surface). Adjacent elementary surfaces may be non-smoothly connected. For example, adjacent elementary surfaces may form a certain angle along their connection edge (e.g. no smaller than 90°). In this case, the elementary surfaces are considered as belonging to a single surface (e.g. corresponding to a geometric surface). Therefore, the three elementary surfaces 221, 222, 223 are considered or grouped as belonging to a single surface. In one embodiment, all (geometric) surfaces connected to each other non-smoothly with an angle no smaller than 900 can be grouped together as belonging to a single surface (or geometric surface).

The maximum distance 243 between the two largest surfaces is taken as thickness value for the further analysis. In an alternate embodiment instead of determining the thickness value based on the maximum distance between two largest surfaces, the thickness can also be manually selected, for example, by manually selecting a source surface and a target surface and by calculating the maximum distance 243 between both surfaces.

Figure 3:
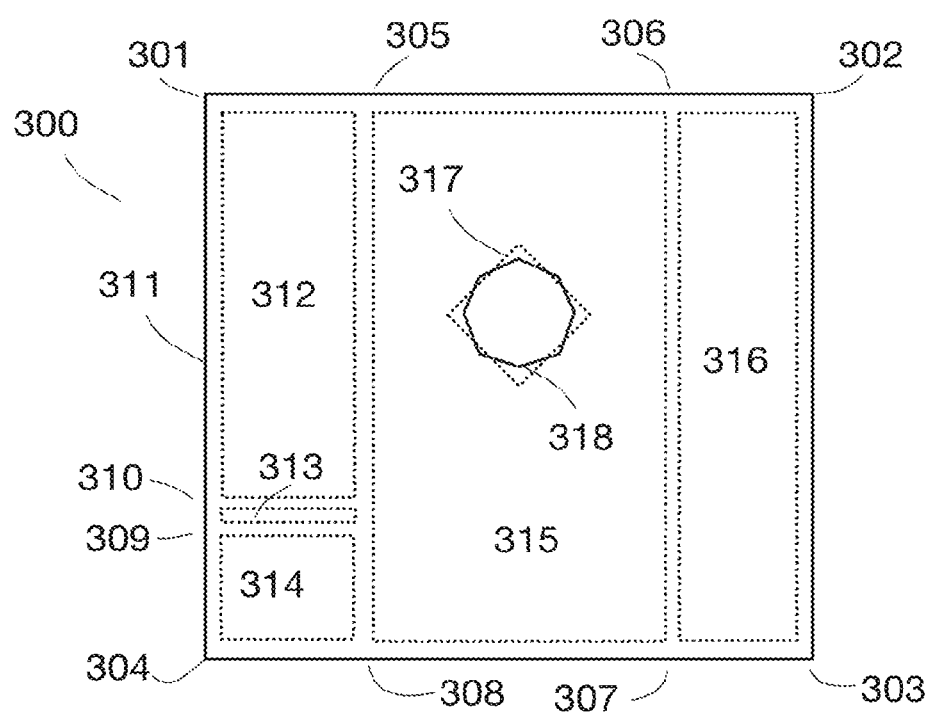
FIG. 3 shows a detection of thin surfaces according to an embodiment of this disclosure.

FIG. 3 depicts the identification of thin surfaces for an embodiment of this disclosure. As thin surfaces, e.g. cross-section surface of a thin wall, should not be used for a source surface, these thin surfaces have to be identified prior to defining a source surface. An identification of thin surfaces can be based on the 3D representation (FIG. 1C) derived based on the geometrical properties of the original object 100. Therefore, based on each face of the 3D blocking representation it can be determined whether a corresponding surface (or geometric surface) of the original object 100 is thin or not. A face in a 3D blocking representation can comprise a plurality of elementary faces. An elementary face can have a plurality of nodes. Nodes of elementary faces of a face are assigned as corner nodes or side nodes of the face according to whether a node is located at a corner of the face or a side (or edge, border) of the face. Therefore, corner nodes and side nodes are assigned to the different parts of a side of the 3D blocking representation.

FIG. 3 shows a single side (or "face") 300 of a 3D blocking representation. Corner nodes 301, 302, 303, and 304 are assigned to the corners of the side of the 3D blocking representation. The face is further be filled with smaller faces 312, 313, 314, 315, and 316 that can have a rectangular shape or a shape of other polygons. The path along the corner nodes on the outer and/or inner border of one or more faces is also referred to as "loop". On the outer loop 311, side nodes 305, 306, 387, 308, 309, and 310 depict the positions where two smaller rectangular faces contained within the loop meet each other. An inner loop 318 represents the rectangular opening 317 in the face 300. Further, "short edges" are determined as edges between corner nodes that are shorter or equal as the obtained thickness. "Long edges" are defined as the edges that are not short edges.

A thin surface can be defined by different rules applied to the faces of a 3D-representation. According to one rule, a face of the 3D-representation bounded by a single loop that contains only short edges is considered or identified as a thin surface of the original object 100. According to a second rule, which can be applied additionally or alternatively, a face bounded by a single loop that contains long edges which are separated by a distance shorter or equal to the obtained thickness can be identified as a thin surface. According to a third rule that can be applied additionally or alternatively, a face (of a 3D-representation) bounded by or in between two loops can be identified as a thin surface (of the original object), if the maximum distance between the two loops is smaller as or equal to the obtained thickness. By this analysis, thin surfaces can be determined robustly from different kinds of geometric input information.

Figure 4A:
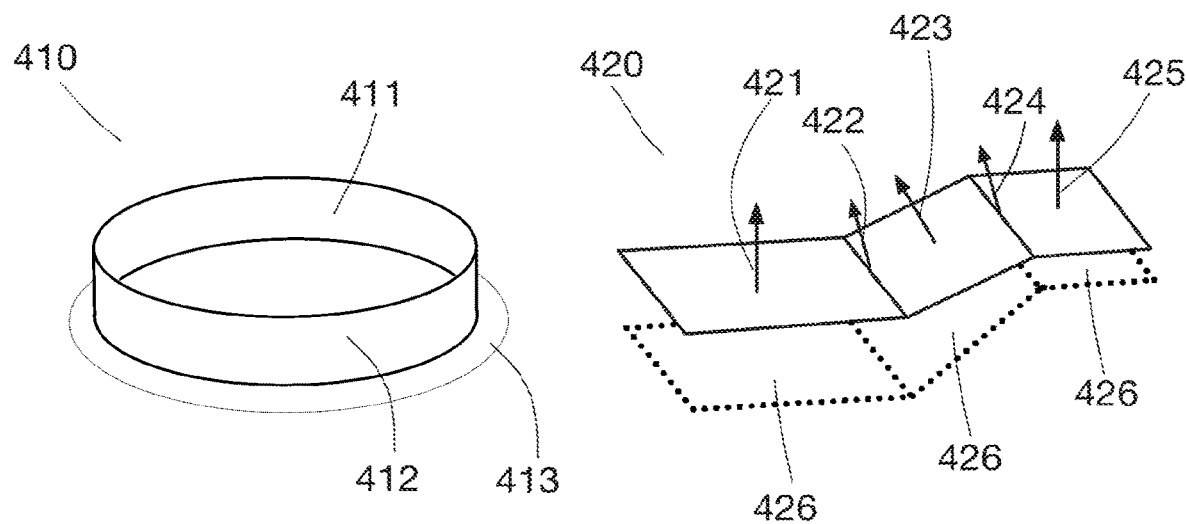
FIGS. 4A, 4B show a determination of a 2D representation of a source surface according to an embodiment of this disclosure.
Figure 4B:
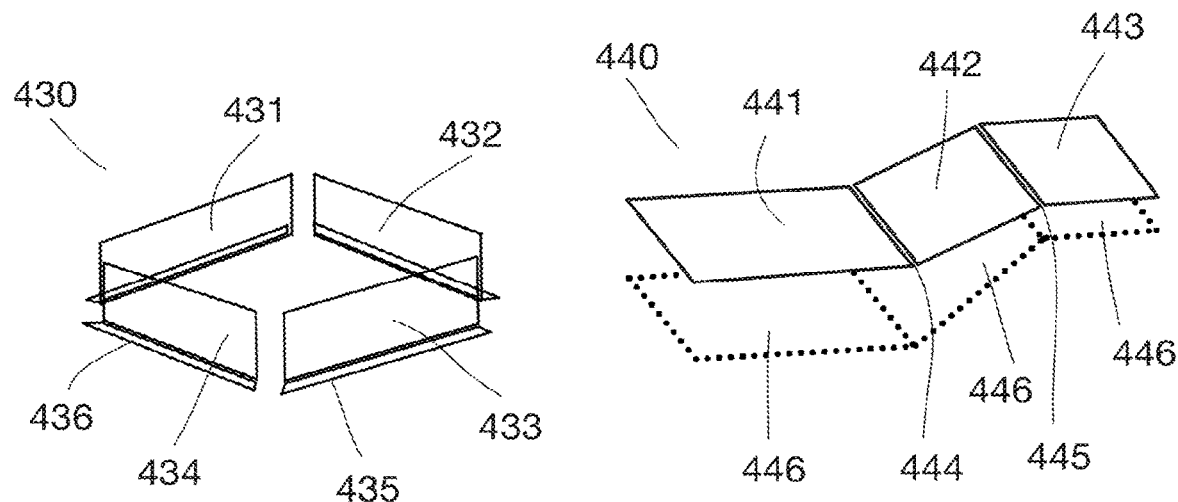

FIG. 4A and FIG. 4B depict the determination of the source surfaces and the formation of 2D representations based on the source surfaces for the two different kinds of objects already presented in the previous figures. In FIG. 4A, on the left-hand side, the inner cylindrical surface 411 of the cylindrical object has been selected as a first source surface and the upper base ring 413 has been selected as a second source surface. On the right-hand side of FIG. 4A the rectangular object is shown in terms of its source surface 420 and its target surface 426. The source surface 420 comprises five different parts (five different elementary surfaces). The plane rectangular parts 421, 423, and 425. In between these parts are the transition lines 422 and 424. In general, the determination of the source surface can be done in various ways. For example, a source surface can be manually selected based on the set of non-thin surfaces. Alternatively, the source surface can be selected based on an adjacent surface or an adjacent mesh. Because the mesh across different surfaces should be consistent, a surface that already contains a mesh can be selected as source surface in order to extend the mesh across the next volume block consistently. Alternatively, surfaces that are non-smooth but contain discontinuities can be selected as source surfaces. This holds for the source surface of the cylindrical object as well as for the source surface of the rectangular object. Also other features can be used for the determination of a source surface. As already described, a source surface can also be determined based on its property that it is a largest area or at least one of the largest areas contained in the set of non-thin surfaces.

After a source surface has been determined a 2D representation of a source surface will be formed in the next step. This will be done in order to prepare the information such that a desired mesh can be obtained during the extrusion of the 2D representation. Therefore, the 2D representation can comprise less features and/or more features as the source surface. Also the shapes (e.g. shapes of elements of a 2D representation or of a 2D face) used for generating the 2D blocking information can differ from the corresponding shapes of the source surface. Furthermore, certain elements of a 2D blocking representation can have a different size as compared to their respective portions of the source surface. On the left-hand side in FIG. 4B, the 2D representation of the cylindrical object 430 is generated. It comprises four rectangular shapes 431, 432, 433, and 434 that represent the cylindrical part of the cylindrical object. Furthermore, the 2D representation comprises four trapezoid shapes 435, 436 to represent the base ring of the cylindrical object. On the right-hand side, the 2D representation 440 of the rectangular object is depicted. As can be seen only the rectangular parts 421, 423, and 425 are represented by the respective faces 441, 442, and 443. The transition lines 422 and 424 are excluded from the source surface representation (444, 445) in order to facilitate the extrusion process in this embodiment.

Figure 5A:
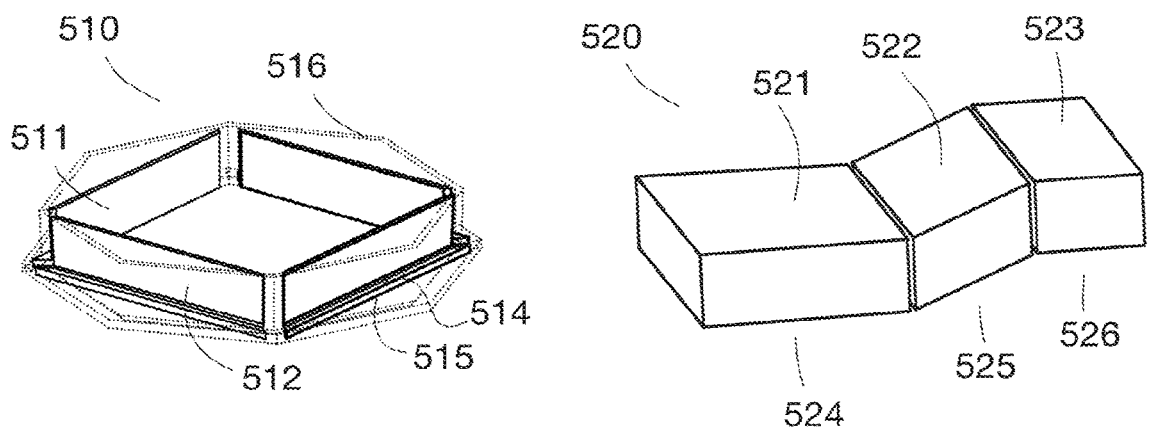
FIGS. 5A-5C show an extrusion and a generation of a mesh according to an embodiment of this disclosure.
Figure 5B:
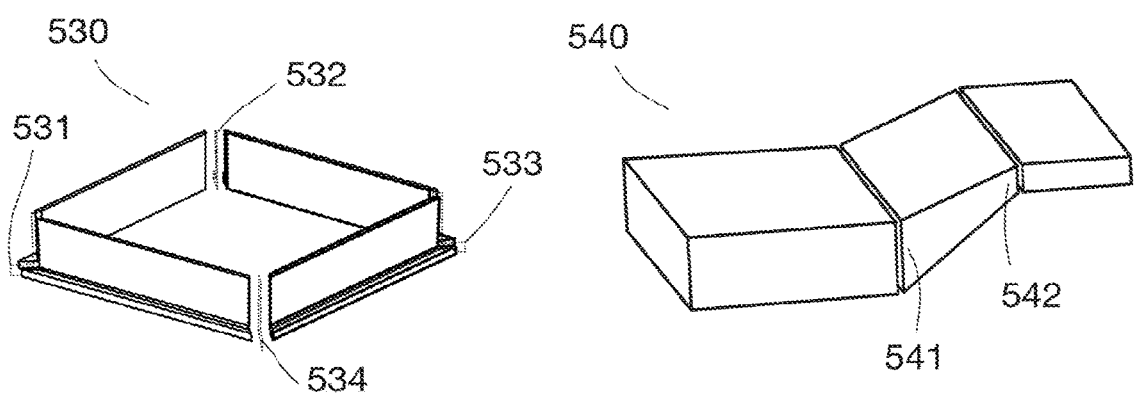
Figure 5C:
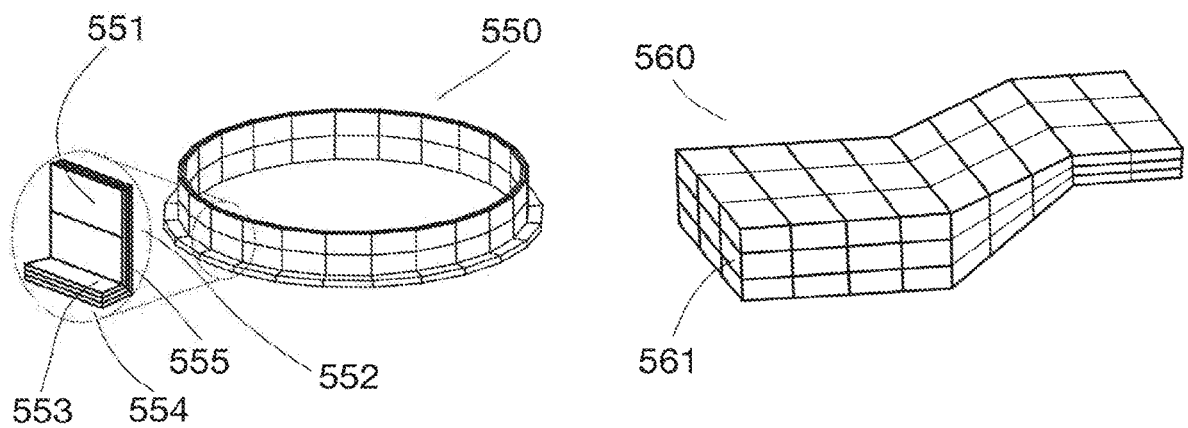

FIGS. 5A, 5B, and 5C depict the extrusion process and the formation of the mesh for the two different kinds of objects also depicted in the previous figures. In FIG. 5A, on the left hand side, the extrusion of the 2D representation of the cylindrical object 510 is depicted. The extrusion is performed based on the 2D representations formed based on the source surface. The extrusion transforms the 2D representation to a single volume block for each face of the 2D representation. The volume blocks have an inner side 511 and an outer side 512. For the base ring, the extrusion transforms the faces of the 2D representation to volume blocks within upper side 514 and a lower side 515. Hence, for each 2D face that represents a part of the source surface a volume block is generated. On the right hand side the extrusion process is illustrated for the rectangular object 520. As can be seen, for each of the 2D faces 521, 522, and 523 a single volume block is generated by extruding the respective 2D face to the respective part of the target surface, which had been established for this object in one of the previous steps.

In FIG. 5B, additional geometric associations established during or after the extrusion are illustrated. On the left inside, for the cylindrical object 530, it is illustrated that information about the cross section of the cylindrical object (e.g. cylindrical wall or shell) is incorporated into the extrusion process. The geometrical associations may be established based on information of the cross sections 531, 532, 533 and 534 of base ring of the cylindrical object. The extrusion can then be performed to match this cross-section. On the right-hand side another geometry association is illustrated for the rectangular object. As shown in FIG. 2A the middle part of the rectangular object 227 is tapered towards the right side. This is taken into account during the extrusion process by extruding the 2D face 522 dependent to its relative position. At the left side 541 the extrusion is larger than at the right side 542 and in between the extrusion is a linear function of the extrusion in these two points. Thereby, the tapered form of the middle part 227 is resembled closely or even exactly by the extrusion process. This can facilitate forming the mesh through the extruded object.

In FIG. 5C it is illustrated how the mesh is finally generated on the basis of the extruded object and on the basis of the original geometric information. On the left hand side, the mesh 550 for the cylindrical object is depicted. As can be seen by the magnified mesh element, a three layer mesh is generated across the non-smooth L-shaped cross section 555 of the cylindrical object. The mesh has an outer layer 551 for the cylindrical part and an upper layer 553 for the base ring part 553. The mesh has an inner layer 552 for the cylindrical part and a lower layer 554 for the base ring part. On the right-hand side, the mesh of the rectangular object is depicted. Three mesh layers 561 are arranged along the thin dimension. As can be seen the three mesh layers are perfectly aligned through the extruded different parts of the rectangular object.

Figure 6:
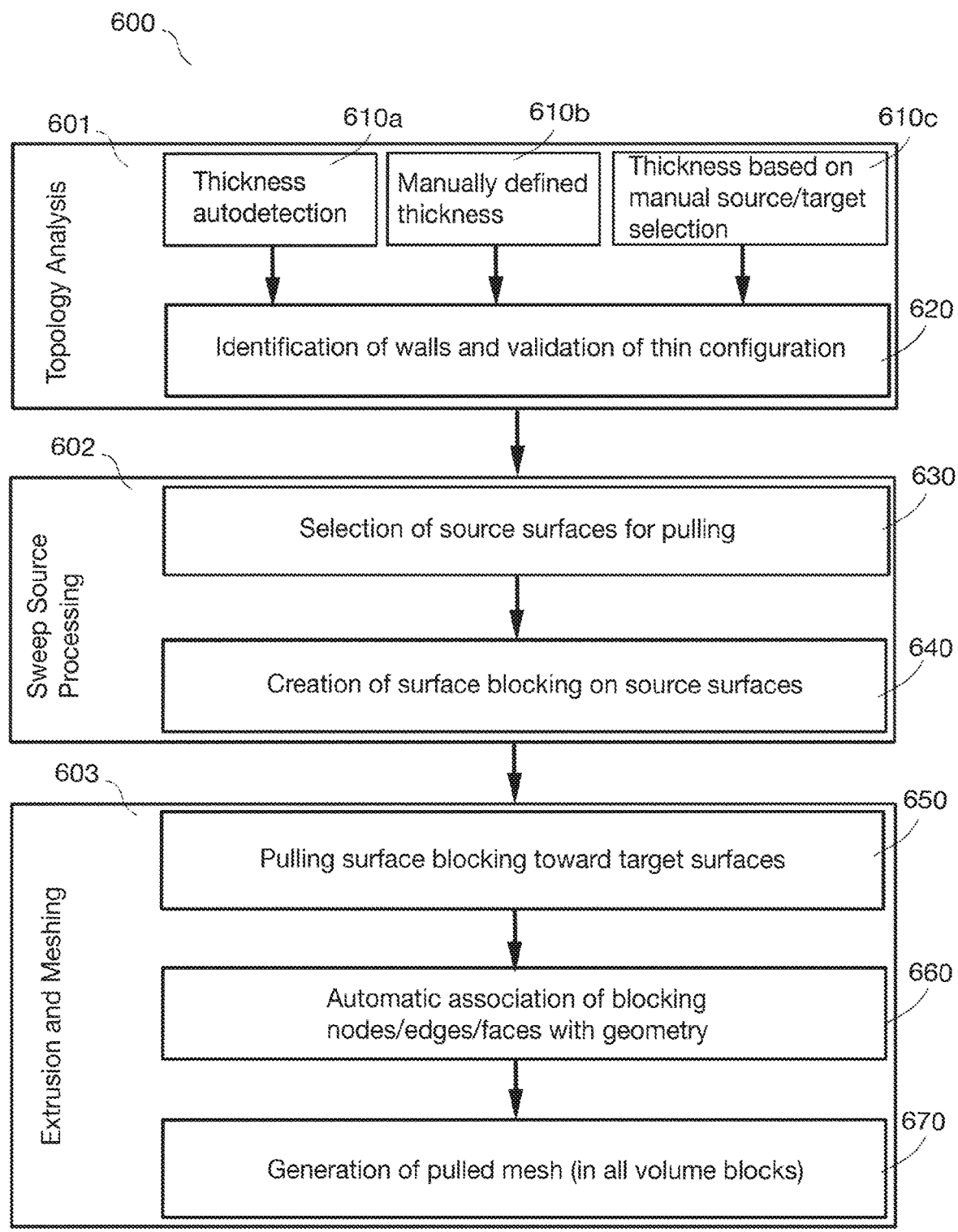
FIG. 6 shows a flow chart for an embodiment of this disclosure.

FIG. 6 depicts a flow chart that describes a process 600 of forming a mesh, according to an embodiment of this disclosure. The flowchart is divided into the three main phases. During the first phase 601 a topology analysis is performed on the basis of the geometric information received at the beginning of the process. During the sweep source processing 602 the extrusion process is prepared in order to form the desired mesh at the end. In the third phase 603 the extrusion is performed, and the mesh is generated. During the first phase 601, in a first step 610 a thickness is determined. The determination of the thickness can be done optionally in different ways. According to one way, the thickness is determined based on a thickness autodetection 610a. In another way, which can be performed additionally or alternatively, the thickness is manually defined 610b.

Additionally or alternatively, the thickness can also be defined indirectly 610c by defining a source and the target surface and by computing the distance between the two surfaces and taking this distance as a thickness value. Based on the obtained thickness value, an identification of thin surfaces is performed in step 620. During this step thin surfaces of the object and the non-thin surfaces of the object are determined. After the non-thin surfaces of the object is known a source surface will be selected from the set of non-thin surfaces during step 630. The source surface is used as a basis for the later extrusion. Based on the source surface a 2D representation of the source surface is generated in step 640. This generation is based on different kinds of information that facilitate and/or control the generation of the mesh. For example, the 2D representation can be a simplified representation of the source surface, at least partly.

Additionally or alternatively, elements can be inserted in the 2D representation that are not part of the source surface in order to control the mesh generation. This can be done in particular in order to control the mesh that is generated through the extruded 3D representation of the object. After the 2D representation has been established the extrusion takes place in step 650. This can be done in the direction of a target surface, which has also been determined before based on the non-thin surfaces. After the extrusion or during the extrusion, further information can be associated with the generated volume blocks in step 660. In a further step 670, the generation of a mesh is performed in all volume blocks.

Figure 7:
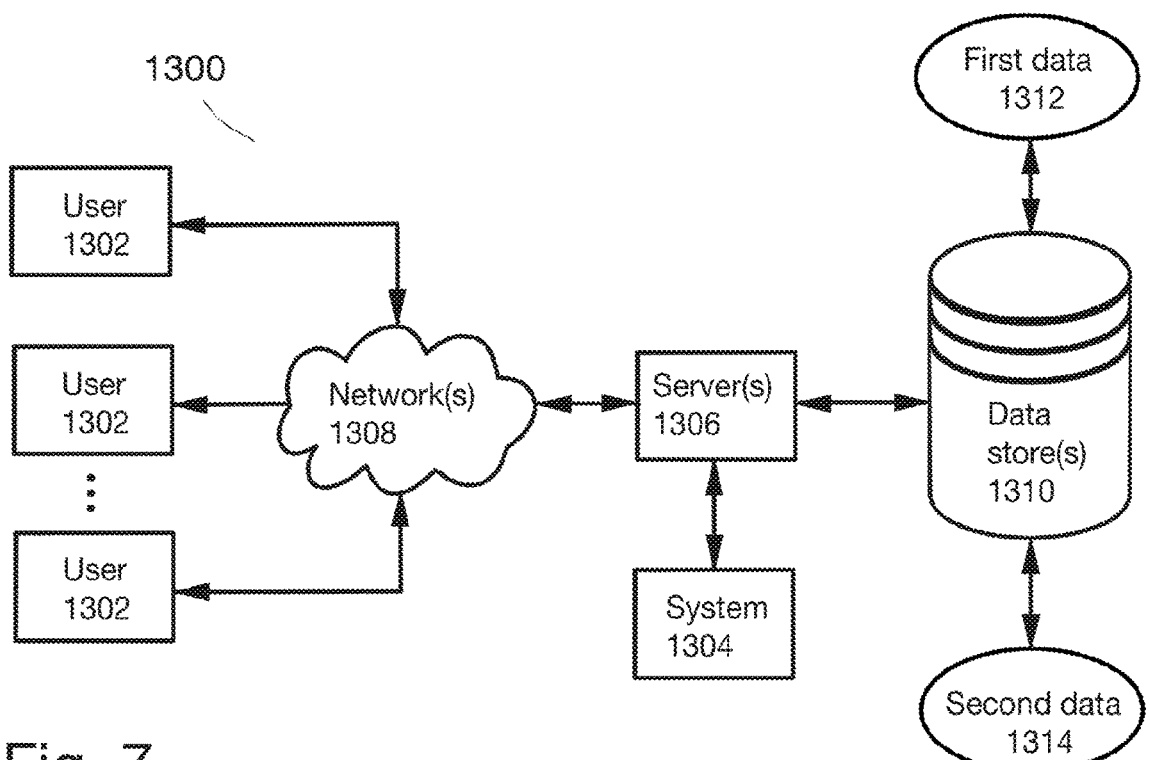
FIG. 7 shows a digital information processing system according to an embodiment of this disclosure.

FIG. 7 depicts a computer-implemented environment 1300 wherein users 1302 can interact with a system 1304 hosted on one or more servers 1306 through a network 1308. The system 1304 contains software operations or routines. The users 1302 can interact with the system 1304 through a number of ways, such as over one or more networks 1308. One or more servers 1306 accessible through the network(s) 1308 can host system 1304. The processing system 1304 has access to a non-transitory computer-readable memory in addition to one or more data stores 1310. The one or more data stores 1310 may contain first data 1312 as well as second data 1314. It should be understood that the system 1304 could also be provided on a stand-alone computer for access by a user.

Figure 8A:
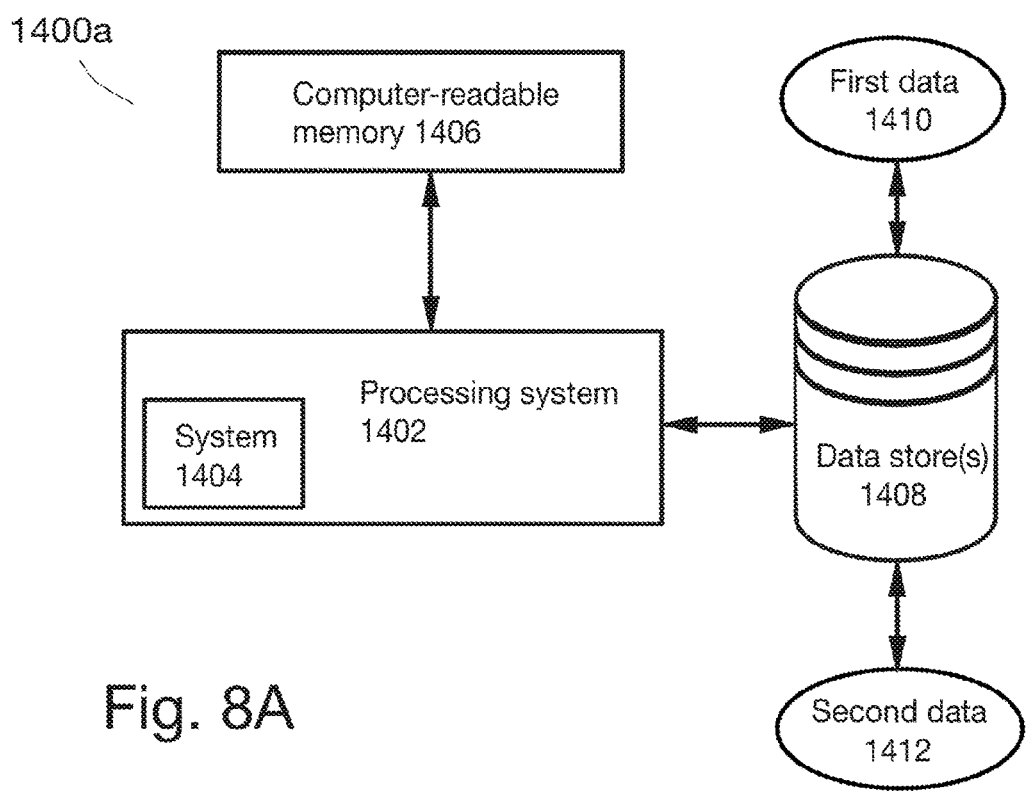
FIGS. 8A-8C show a digital information processing system according to an embodiment of this disclosure.
Figure 8B:
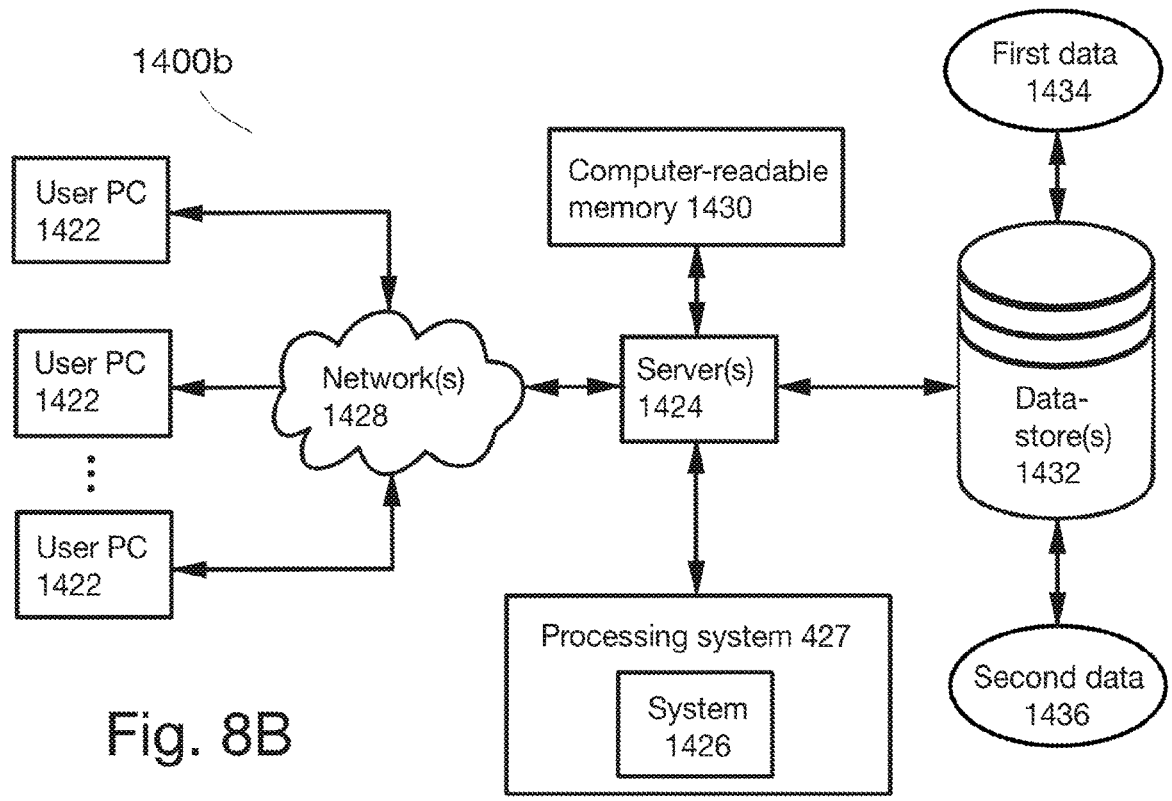
Figure 8C:
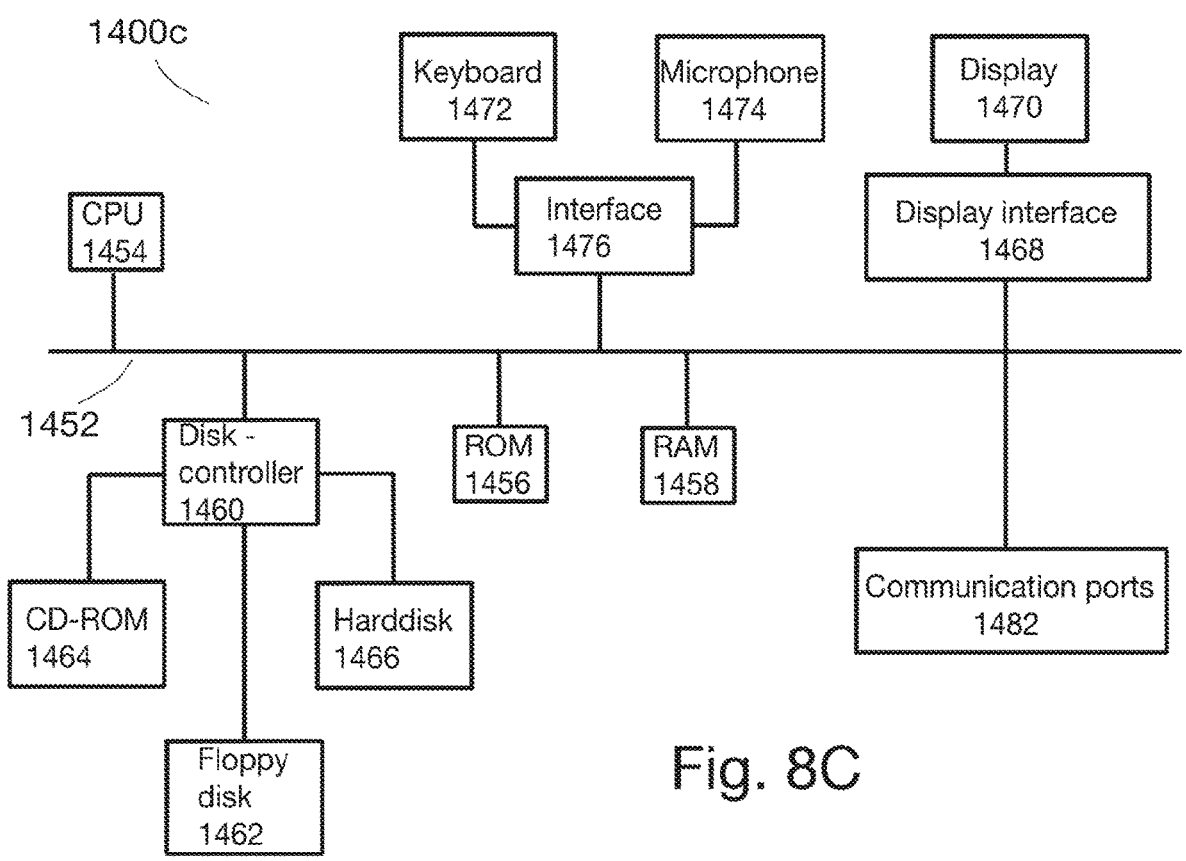

FIGS. 8A, 8B and 8C depict example systems for use in implementing a system. For example, FIG. 8A depicts an exemplary system 1400a that includes a standalone computer architecture where a processing system 1402 (e.g., one or more computer processors) includes a system 1404 being executed on it. The processing system 1402 has access to a non-transitory computer-readable memory 1406 in addition to one or more data stores 1408. The one or more data stores 1408 may contain first data 1410 as well as second data 1412.

FIG. 8B depicts a system 1400b that includes a client server architecture. One or more user PCs 1422 can access one or more servers 1424 running a system 1426 on a processing system 1427 via one or more networks 1428. The one or more servers 1424 may access a non-transitory computer readable memory 1430 as well as one or more data stores 1432. The one or more data stores 1432 may contain first data 1434 as well as second data 1436.

FIG. 8C shows a block diagram of exemplary hardware for a standalone computer architecture 1400c, such as the architecture depicted in FIG. 8A, that may be used to contain and/or implement the program instructions of system embodiments of the present disclosure. A bus 1452 may serve as the information highway interconnecting the other illustrated components of the hardware. A processing system 1454 labeled CPU (central processing unit) (e.g., one or more computer processors), may perform calculations and logic operations required to execute a program. A non-transitory computer-readable storage medium, such as read only memory (ROM) 1456 and random-access memory (RAM) 1458, may be in communication with the processing system 1254 and may contain one or more programming instructions. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium.

A disk controller 1460 boundary layers one or more optional disk drives to the system bus 1452. These disk drives may be external or internal floppy disk drives such as 1462, external or internal CD-ROM, CD-R, CD-RW or DVD drives such as 1464, or external or internal hard drives 1466. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 1460, the ROM 1456 and/or the RAM 1458. Preferably, the processor 1454 may access each component as required.

A display boundary layer 1468 may permit information from the bus 1456 to be displayed on a display 1470 in audio, graphic, or alphanumeric format. Communication with external devices may optionally occur using various communication ports 1482.

In addition to the standard computer-type components, the hardware may also include data input devices, such as a keyboard 1472, or other input device 1474, such as a microphone, remote control, pointer, mouse, touchscreen and/or joystick. These input devices can be coupled to bus 452 via boundary layer 1476.

What is claimed is:

1. A non-transitory machine-readable medium having executable instructions to cause one or more processing units to perform a method comprising:
    obtaining a geometric representation of an object including a thin structure having a first surface and a second surface;
    generating one or more 2D blocking faces as a simplified representation of one of the first surface or the second surface;
    generating one or more 3D blocks based on an extrusion of the one or more 2D blocking faces; and
    determining a 3D mesh of the object based on the one or more 3D blocks.

2. The non-transitory machine-readable medium of claim 1, wherein the method further comprises:
    obtaining a thickness of the thin structure.

3. The non-transitory machine-readable medium of claim 2, wherein the thickness is obtained via a user interface presenting the geometries of the first surface and the second surface.

4. The non-transitory machine-readable medium of claim 2, wherein the thickness is obtained based on the geometric representation of the object.

5. The non-transitory machine-readable medium of claim 2, wherein the method further comprises:
    determining the two largest surfaces of the object based on the representation of the object, wherein the two largest surfaces correspond to the first and the second surface; and
    determining the thickness as a distance between the two largest surfaces of the object.

6. The non-transitory machine-readable medium of claim 2, wherein the method further comprises:
    determining a simplified 3D blocking representation of the object based on the thickness of the object.

7. The non-transitory machine-readable medium of claim 6, wherein the 3D blocking representation includes one or more faces, each face having edges and nodes, the method further comprising:
    grouping the one or more faces as a set of connected faces bounded by a loop comprising edges that extend between nodes; and
    identifying a surface of the object corresponding to the set of connected faces as a thin surface indicating the object including the thin structure.

8. The non-transitory machine-readable medium of claim 7, wherein the thin surface is identified based on dimensions of one or more of the edges equal to or shorter than the determined thickness.

9. The non-transitory machine-readable medium of claim 1, the method further comprising:
    identifying the one of the first surface or the second surface as a source surface for the extrusion, wherein the source surface is shared between the object and a separate object.

10. The non-transitory machine-readable medium of claim 1, wherein a face of the one or more 2D blocking faces and a corresponding face of the 3D blocking representation represent different geometric features of a surface of the object.

11. The non-transitory machine-readable medium of claim 1, wherein the generating of the one or more 2D blocking faces is based on a pre-defined shape or a pre-defined size.

12. The non-transitory machine-readable medium of claim 1, wherein the extrusion is performed from the one or more 2D blocking faces to another one of the first surface or the second surface as a target surface.

13. The non-transitory machine-readable medium of claim 1, wherein the extrusion of the one or more 2D blocking face is based on geometrical information of the object.

14. The non-transitory machine-readable medium of claim 1, wherein the determination of the 3D mesh is based on a predefined number of mesh layers.

15. A computer implemented method comprising:
obtaining a geometric representation of an object;
determining a surface of the object as a thin surface indicating the object including a thin structure based on the geometric representation of the object, wherein the thin surface is adjacent to a first surface and a second surface of the thin structure, the first surface and the second surface being larger in size than the thin surface;
identifying one of the first surface or the second surface of the thin structure as a source surface for an extrusion;
determining one or more 2D blocking faces as a simplified representation of the source surface;
performing the extrusion from the one or more 2D blocking faces toward another one of the first surface or the second surface, wherein a 3D representation of the object is established based on the extrusion of the one or more 2D blocking faces; and
generating a 3D mesh based on the 3D representation of the object.

16. A system comprising:
a memory storing instructions;
one or more processors coupled to the memory, the one or more processors executing the instructions from the memory to perform a method comprising:
obtaining a geometric representation of an object, the geometric representation including a narrow surface, a first surface and a second surface for a thin structure of the object and wherein the narrow surface being adjacent to the first surface and the second surface;
generating at least one blocking face as a simplified representation of the first surface;
generating a volume block based on an extrusion from the at least one blocking face towards the second surface; and
generating a 3D mesh for the object based on the volume block.

* * * * *